US010522504B2

(12) United States Patent
Magni et al.

(10) Patent No.: US 10,522,504 B2
(45) Date of Patent: Dec. 31, 2019

(54) SEMICONDUCTOR DEVICE AND CORRESPONDING METHOD

(71) Applicant: STMICROELECTRONICS S.R.L., Agrate Brianza (IT)

(72) Inventors: Pierangelo Magni, Villasanta (IT); Alberto Arrigoni, Eupilio (IT)

(73) Assignee: STMICROELECTRONICS S.R.L., Agrate Brianza (IT)

( * ) Notice: Subject to any disclaimer, the term of this patent is extended or adjusted under 35 U.S.C. 154(b) by 0 days.

(21) Appl. No.: 15/175,930

(22) Filed: Jun. 7, 2016

(65) Prior Publication Data

US 2017/0125371 A1 May 4, 2017

(30) Foreign Application Priority Data

Nov. 4, 2015 (IT) .......................... 102015000068771

(51) Int. Cl.
*H01L 23/00* (2006.01)

(52) U.S. Cl.
CPC .............. *H01L 24/92* (2013.01); *H01L 24/13* (2013.01); *H01L 24/16* (2013.01); *H01L 24/29* (2013.01); *H01L 24/73* (2013.01); *H01L 24/81* (2013.01); *H01L 24/11* (2013.01); *H01L 24/83* (2013.01); *H01L 2224/11462* (2013.01); *H01L 2224/133* (2013.01); *H01L 2224/13019* (2013.01); *H01L 2224/13023* (2013.01); *H01L 2224/13111* (2013.01); *H01L 2224/13147* (2013.01); *H01L 2224/13291* (2013.01); *H01L 2224/13564* (2013.01); *H01L 2224/13611* (2013.01);

(Continued)

(58) Field of Classification Search
CPC .............. H01L 23/473; H01L 23/3738; H01L 2223/06517; H01L 2225/06517
See application file for complete search history.

(56) References Cited

U.S. PATENT DOCUMENTS 5,840,417 A * 11/1998 Bolger ................. H01L 21/563
257/E21.503
5,886,408 A * 3/1999 Ohki ....................... H01L 23/16
257/705

(Continued)

FOREIGN PATENT DOCUMENTS

| JP | 60-91331 A | 5/1985 |
|---|---|---|
| JP | 62-122137 A | 6/1987 |
| WO | 2007/063510 A2 | 6/2007 |

OTHER PUBLICATIONS

TESPRO Co., Ltd, TESPRO Catalog, ver. 1, 2012, 49 pages.

*Primary Examiner* — Marcos D. Pizarro
*Assistant Examiner* — Quinton A Brasfield
(74) *Attorney, Agent, or Firm* — Seed Intellectual Property Law Group LLP

(57) ABSTRACT

In an embodiment, a semiconductor device includes: a mounting substrate having electrically conductive formations thereon, a semiconductor die coupled with the mounting substrate, the semiconductor die with electrical contact pillars facing towards the mounting substrate, an anisotropic conductive membrane between the semiconductor die and the mounting substrate, the membrane compressed between the electrical contact pillars and the mounting substrate to provide electrical contact between the electrical contact pillars of the semiconductor die and the electrically conductive formations on the mounting substrate.

10 Claims, 3 Drawing Sheets

(52) U.S. Cl.
CPC ............... *H01L 2224/16227* (2013.01); *H01L 2224/2929* (2013.01); *H01L 2224/29036* (2013.01); *H01L 2224/73153* (2013.01); *H01L 2224/73253* (2013.01); *H01L 2224/816* (2013.01); *H01L 2224/8185* (2013.01); *H01L 2224/81191* (2013.01); *H01L 2224/81193* (2013.01); *H01L 2224/81591* (2013.01); *H01L 2224/81901* (2013.01); *H01L 2224/83192* (2013.01); *H01L 2224/83447* (2013.01); *H01L 2224/83455* (2013.01); *H01L 2224/83851* (2013.01); *H01L 2224/92125* (2013.01); *H01L 2224/92242* (2013.01); *H01L 2924/16152* (2013.01); *H01L 2924/16235* (2013.01); *H01L 2924/16747* (2013.01); *H01L 2924/351* (2013.01)

(56) References Cited

U.S. PATENT DOCUMENTS

| | | |
|---|---|---|
| 6,081,038 A | 6/2000 | Murayama |
| 7,159,313 B2 * | 1/2007 | Sathe .................... H01L 23/055 29/846 |
| 2001/0008169 A1 * | 7/2001 | Connell .................... C09J 9/02 156/298 |
| 2003/0076128 A1 * | 4/2003 | Ohtaki .................... G01K 1/16 324/750.05 |
| 2006/0054867 A1 * | 3/2006 | Yamada .................... C09J 9/02 252/500 |
| 2006/0289978 A1 | 12/2006 | Lien |
| 2007/0013067 A1 * | 1/2007 | Nishida ................. H01L 21/563 257/737 |
| 2008/0099925 A1 * | 5/2008 | Irsigler ................. H01L 21/563 257/778 |
| 2008/0206907 A1 * | 8/2008 | Shishido ............ G01R 31/2875 438/17 |
| 2008/0315389 A1 * | 12/2008 | Nunn ................. H01L 23/3121 257/690 |
| 2011/0155430 A1 * | 6/2011 | Lee ............................ C09J 9/02 174/257 |
| 2013/0221536 A1 * | 8/2013 | Gregorich ............... H01L 24/13 257/774 |
| 2013/0249086 A1 * | 9/2013 | Lin ........................ H01L 24/11 257/737 |
| 2014/0216654 A1 | 8/2014 | Keite-Telgenbüscher |

* cited by examiner

SEMICONDUCTOR DEVICE AND CORRESPONDING METHOD

BACKGROUND

Technical Field

The description relates to semiconductor devices.

One or more embodiments may apply, e.g., to mounting Flip Chip dice on a substrate (e.g., with a high I/Os number) by using electrical contact pillars.

Description of the Related Art

Various methods may be adopted for connecting dice to substrates such as printed circuit boards—PCBs by using pillars. An electrolytic growth of metal (e.g., copper) on top of die pads, possibly with a topping of reflowable material (e.g., tin) at the top may be exemplary of such a pillar.

These methods may include e.g., mass reflow or thermocompression.

Mass reflow is an operation performed in a controlled environment (e.g., in a temperature-controlled oven) to produce reflow of the topping material of the pillars on metal areas of a PCB in order to ensure electrical continuity.

Thermo-compression is an operation performed in order to provide for a certain time electrical contact of the pillars while the material between the die and a substrate undergoes curing to provide a force via shrinkage.

High temperature operation, which may induce stresses on joints, may be a critical factor in mass reflow.

A long cycle time may be a disadvantage of thermocompression.

Both processes (mass reflow and a thermo-compression) may turn out to be critical in terms of package reliability, e.g., leading to a short life-on-board of components due to loss of electrical contact.

Also, deformation/damage of the topping material (e.g., tin) during pillar testing (EWS) may lead to the formation of "indents" where air may be trapped with the risk of causing failure of the electrical connection due to thermal stresses during application life.

Additionally, pillars located at the die corners may be subject to relevant shear and traction stresses due to different expansion coefficients of the semiconductor die (e.g., silicon) and the PCB (e.g., an organic substrate). Shear and traction stresses in those areas may lead to failure of the electrical connections.

Also, it was observed that ball grid array—BGA devices using, e.g., Cu pillars may not provide the same reliability levels of plastic packages, which may be a limiting factor in various areas such as the automotive sector.

BRIEF SUMMARY

One or more embodiments are directed to arrangements offering improved contact between a semiconductor die and a substrate, such as a substrate of a package, another device, or a printed circuit board.

One or more embodiments are directed to a semiconductor device and a method of forming same.

One embodiment is directed to a semiconductor device comprising a substrate. The substrate includes electrically conductive formations at a surface of the substrate. The device further includes a semiconductor die coupled to the substrate. The semiconductor die has electrical contact pillars facing the substrate. The device further includes an anisotropic conductive membrane between the semiconductor die and the substrate. The anisotropic conductive membrane is compressed between the electrical contact pillars and the substrate to provide electrical contact between the electrical contact pillars of the semiconductor die and the electrically conductive formations of the substrate.

One or more embodiments may offer one or more of the following advantages:

- using an anisotropic conductive membrane leads to less stringent requirements or specifications in terms of accuracy in positioning the die onto a substrate and the electrically conductive formations (e.g., metal pads) provided thereon;
- less stringent accuracy requirements or specifications may apply to positioning a semiconductor die onto an anisotropic membrane: for instance, an offset such as ¼ of the pillar separation (pitch) may still provide correct electrical contact of the pillars to the substrate metal pads;
- the anisotropic membrane may allow for differences in thermal expansion coefficients (and relative mismatch during package life) while providing satisfactory electrical performance also in offset conditions with shear stress absorbed by the membrane.

BRIEF DESCRIPTION OF THE SEVERAL VIEWS OF THE FIGURES

One or more embodiments will now be described, by way of example only, with reference to the annexed figures, wherein.

DETAILED DESCRIPTION

Figure 1:
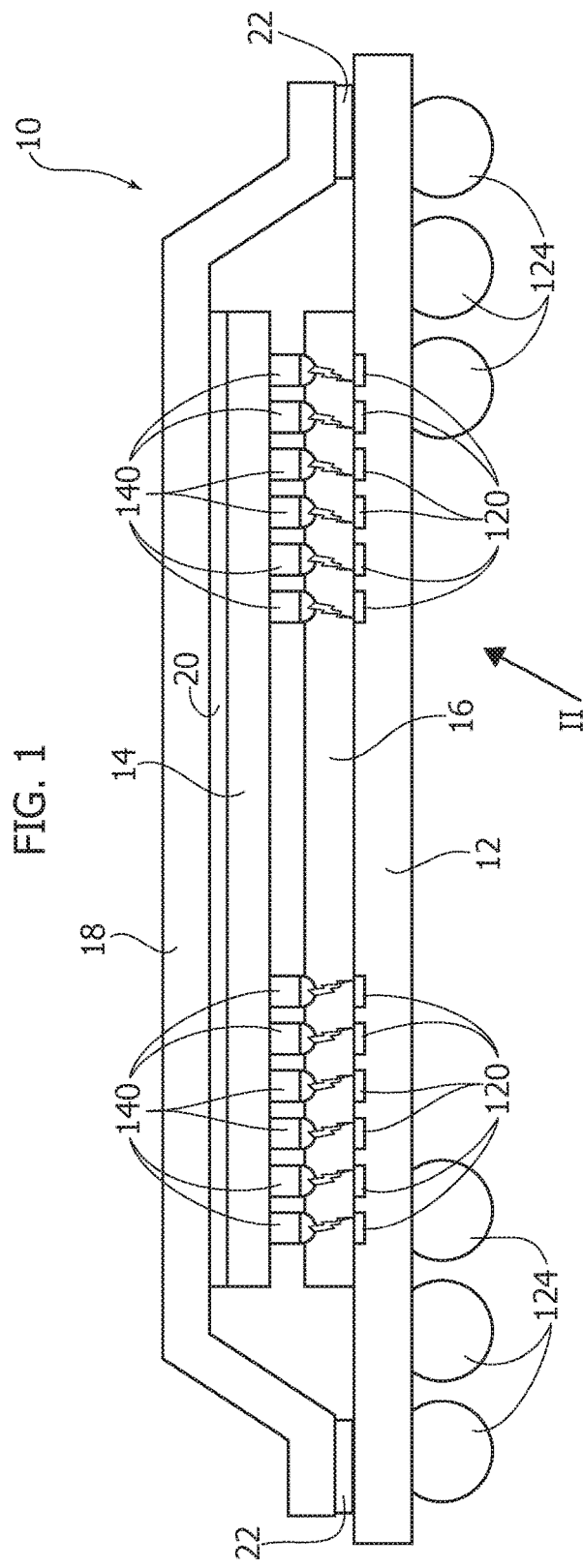
FIG. 1 is a cross-sectional view of a semiconductor device according to one or more embodiments, FIGS. 2 and 3 reproduce to an enlarged scale the portion of FIG. 1 indicated by the arrow II, and FIG. 4, which includes four portions designated a) to d), is exemplary of a process according to one or more embodiments.

In the ensuing description one or more specific details are illustrated, aimed at providing an in-depth understanding of examples of embodiments. The embodiments may be obtained without one or more of the specific details, or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment. Moreover, particular conformations, structures, or characteristics may be combined in any adequate way in one or more embodiments.

The references used herein are provided merely for convenience and hence do not define the extent of protection or the scope of the embodiments.

In the figures, reference 10 denotes a semiconductor device with a mounting substrate 12 having electrically conductive formations 120, e.g., electrically conductive lines or tracks, provided thereon. In one or more embodiments, the mounting substrate 12 may include a printed circuit board—PCB.

Such substrates 12 with electrically conductive formations 120 include conductive and insulative layers as is well known in the art. Further details about the substrates and conductive formations are conventional in the art, and thus will not be shown and described further so as not to obscure the invention.

In one or more embodiments, the substrate 12 may be provided with conductive elements 124, e.g., solder ball for mounting the device 10 onto another corresponding electrical apparatus, such as printed circuit board, semiconductor devices or packages (not shown in the figures).

A semiconductor die 14 (or chip) is mounted on the substrate 12. The semiconductor die includes one or more electrical components, such as integrated circuits as is well known in the art. The integrated circuits may be analog or digital circuits implemented as active devices, passive devices, conductive layers, and dielectric layers formed within the die and electrically interconnected according to the electrical design and function of the die.

In one or more embodiments, the semiconductor die 14 may be provided with electrical contact pillars 140 for making electrical contact with the electrically conductive formations 120.

In one or more embodiments, the contact pillars 140 may be provided according to a (e.g., I/O) contact layout or pattern complementary to a layout or pattern of the electrically conductive formations 120 (e.g., electrical lines or tracks) on the substrate 12.

Figure 2:
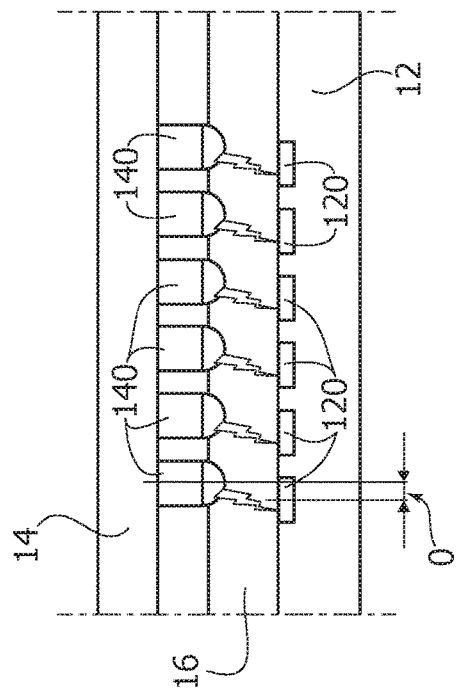
Figure 3:
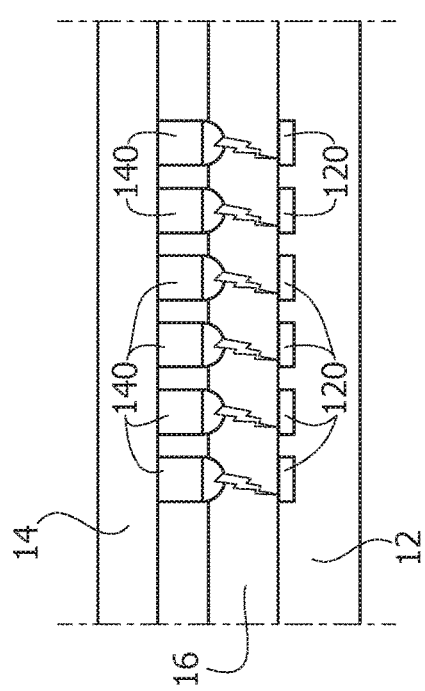

In one or more embodiments, the electrical contact pillars 140 may include (in a manner known per se) an electrolytic growth of metal material (e.g., copper—Cu) on the die pads of the semiconductor die 14 (optionally with a rounded, that is, non-flat tip) protruding downwardly of the semiconductor die 14 as shown in FIGS. 1 to 3.

In one or more embodiments the electrical contact pillars 140 may include a topping of a reflowable material (e.g., tin—Sn) facing towards the substrate 12 (that is, 3). The possible presence of a "soft" material such as Tin may provide a soft surface during wafer probing (electrical test), compensating the non-planarity of all tips (e.g., the probes can slightly "sink" into a material such as tin).

An anisotropic conductive membrane 16 is arranged between the semiconductor die 14 and the mounting substrate 12. The anisotropic conductive membrane 16 provides electrical contact between the electrical contact pillars 140 the semiconductor die 14 and the electrically conductive formations 120 on the mounting substrate.

Figure 5:
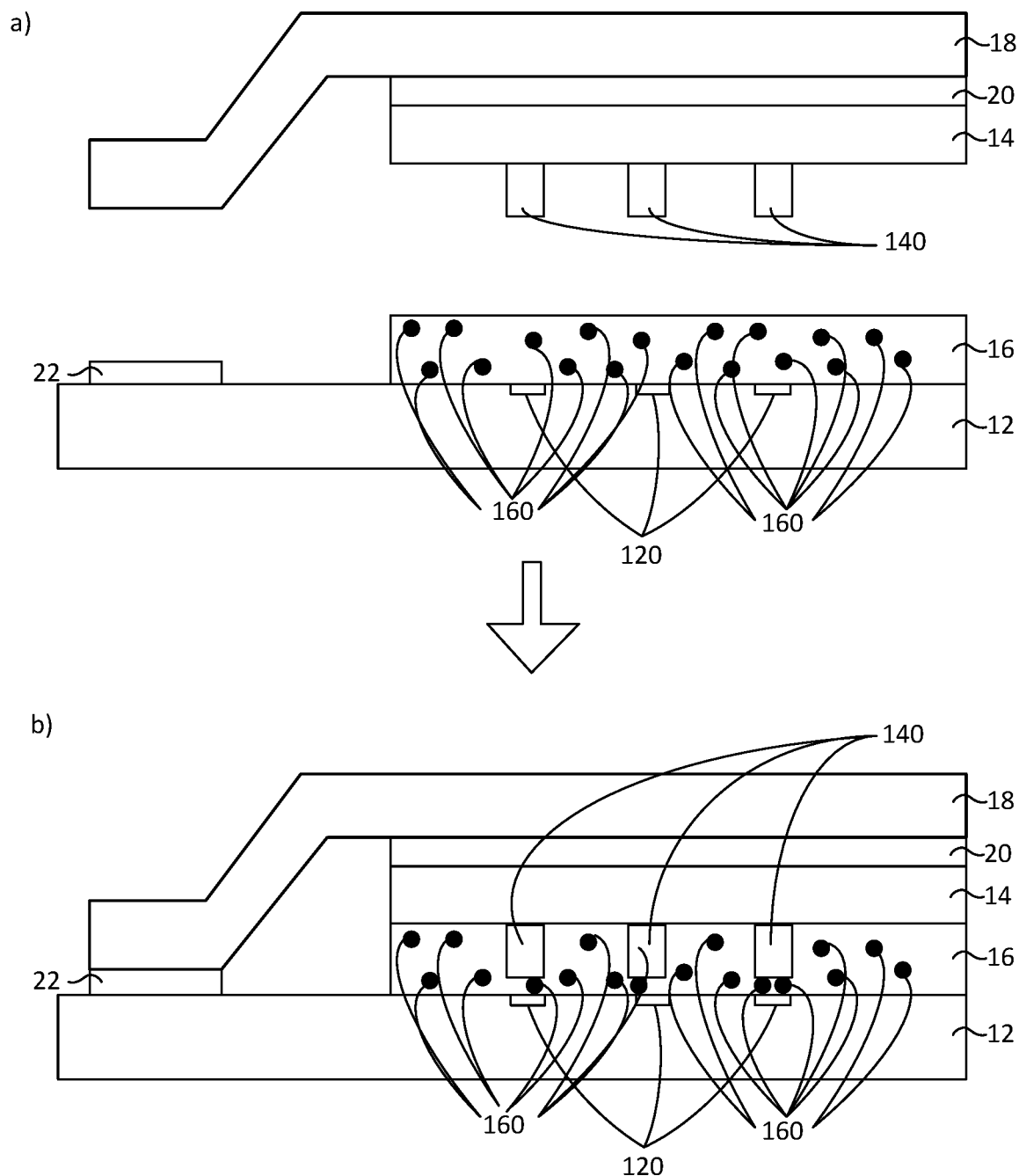
FIG. 5, which includes two portions designated a) and b), is a cross-sectional view of a portion of a semiconductor device during an exemplary process according to one or more embodiments.

In one or more embodiments, the anisotropic conductive membrane 16 includes a material with metallic fibers 160 that, once compressed, are capable of selective and vertical electrical connections ("vertical" meaning the direction transverse to the upper and/or lower surfaces of the membrane), as shown in part b) of FIG. 5.

In one or more embodiments, the anisotropic conductive membrane 16 may include an electrically insulating matrix (e.g., rubber) having electrically conductive fibers 160 (e.g., metal fibers) distributed therein as shown in part a) of FIG. 5.

In one or more embodiments, the anisotropic conductive membrane 16 may include an anisotropic conductive rubber.

Exemplary of an anisotropic conductive membrane 16 adapted for use in one or more embodiments are the anisotropic conductive rubbers commercially available with TES-PRO CO., LTD. of Tokyo, Japan.

One or more embodiments may provide for pressing the electrical contact pillars 140 of the semiconductor die 14 against the anisotropic conductive membrane 16 so that the membrane 16 may be compressed between the pillars 140 and the mounting substrate 12 to provide electrical contact between the pillars 140 and the electrically conductive formations 120 on the mounting substrate 12.

In one or more embodiments a cap member 18 including, e.g., metal material such as copper, possibly with an outer nickel plating, may be coupled to the semiconductor die 14 in order to provide such the compressive force.

For instance, in one or more embodiments, the cap member 18 may be a vat-shaped member having the semiconductor die 14 arranged therein.

In one or more embodiments, the semiconductor die 14 may be arranged to lie against the web (bottom) wall of the cap member 18, possibly with the interposition of an adhesive layer 20 of, e.g., a glue material.

In one or more embodiments, the cap member 18 may be coupled (e.g., peripherally) to the mounting substrate 12.

In one or more embodiments, the cap member 18 may be coupled with the mounting substrate 12, e.g., by using conductive (e.g., including a silver-based filler, for grounding and electromagnetic shielding) or non-conductive adhesives as schematically indicated at 22.

In one or more embodiments, the anisotropic conductive membrane 16 may be coupled with the substrate 12 by adhesive material, e.g., by gluing it onto the substrate 12.

In one or more embodiments, the whole structure as depicted in FIG. 1 may be shaped and dimensioned in order to provide a compression force of the pillars 140 against the anisotropic conductive membrane 16 such that the areas/locations compressed between the pillars 140 and the electrically conductive formations 120 on the substrate 12 are rendered electrically conductive thus providing selective (that is, surrounded by non-conductive areas) vertical electrical connections between the pillars 140 and the formations 120, respectively.

In one or more embodiments, such shaping and dimensioning may involve, e.g., selecting the "height" or depth of the cap 18 in a coordinated manner with the thickness of the semiconductor die 14, the height or length of the pillars 140, the thickness of the membrane 16 as well as the possible thicknesses of the glue layers 20, 22, the thickness of the glue layer between the membrane 16 and the substrate 12 (and so on). The specific characteristics and the type of isotropic conductive membrane 16 used may dictate the design options referred to in the foregoing.

An arrangement as disclosed herein may be largely compensative of tolerances in the parts of the device 10 and in coupling there between.

FIGS. 2 and 3 are schematically exemplary of the capability of the anisotropic conductive membrane 16 to provide electrical contact between the electrical contact pillars 140 and the electrically conductive formations 120 on the mounting substrate 12 even in the presence of a (lateral) offset there between. The accuracy specifications in, e.g., positioning the anisotropic conductive membrane 16 onto the substrate 12 and the formations (metal pads) 120 may thus be relaxed.

The exemplary depiction of FIG. 3 shows that an offset O as large as ¼ of the pitch (spacing) between the pillars 14 may still provide adequate electrical contact between the pillars 140 and the electrically conductive pads 120 on the mounting substrate 12.

Figure 4:
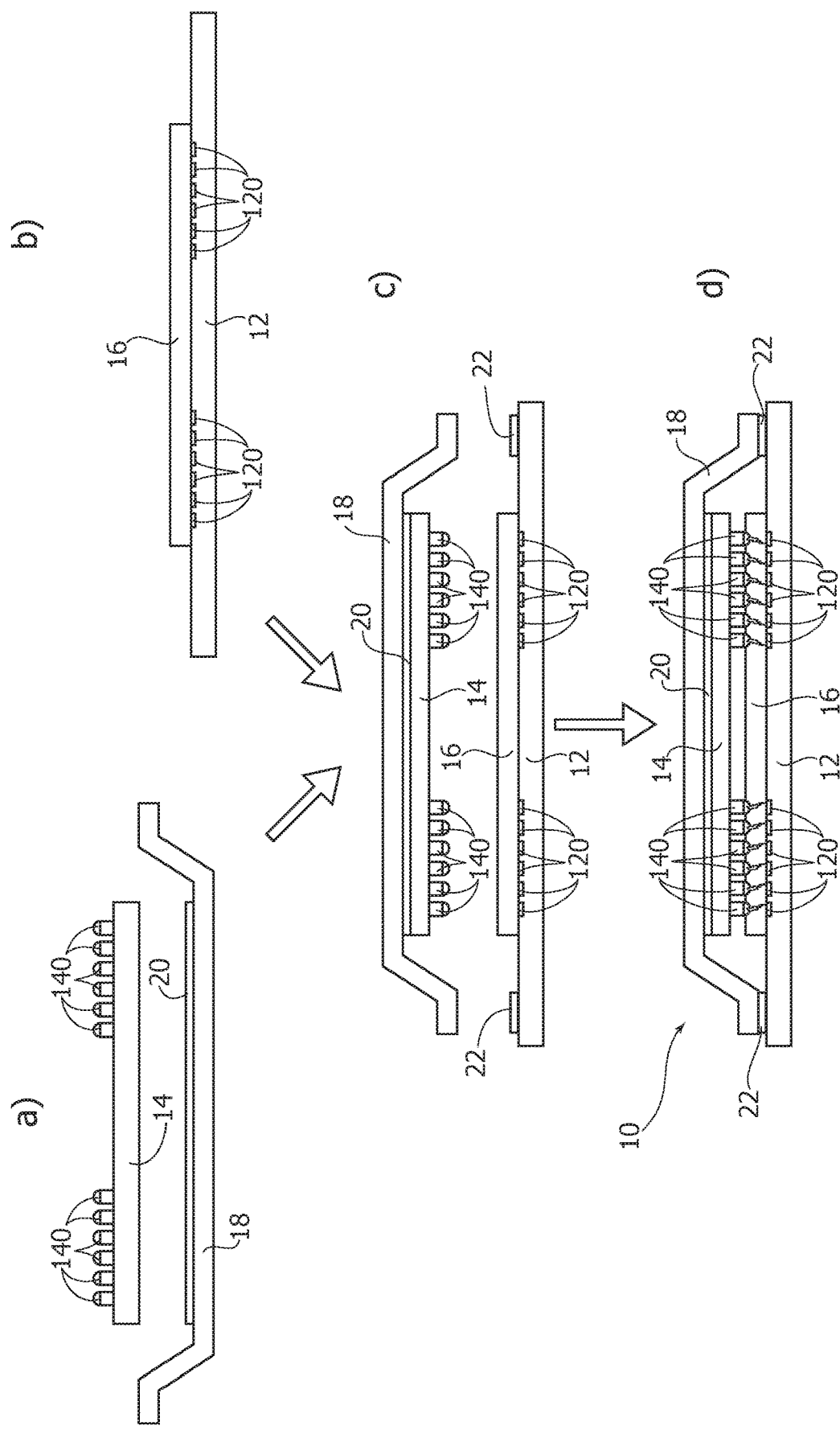

The various parts of FIG. 4 are exemplary of a process which may be adopted for assembling a device as exemplified in the previous figures.

Specifically, part a) of FIG. 4 shows a semiconductor die 14 arranged in the cap 18 and coupled (e.g., glued at 20) therewith with the contact pillars 140 facing outwardly of the (e.g., vat-like) cap member 18.

Part b) shows the membrane 16 applied (e.g., adhesively) onto the substrate 12 with the electrically conductive formations 120 facing towards the membrane 16.

Part c) shows the cap 18—with the semiconductor die 14 arranged therein—mounted onto the substrate 12 by, e.g., coupling it to the substrate 12 at 22.

The sequence of parts a) to c) of FIG. 4 is exemplary of one or more embodiments where the semiconductor die 14 may be positioned from above into the cap member 18 facing upwardly, with the cap member 18 having the semiconductor die 14 arranged therein subsequently overturned for mounting onto the substrate 12 with the membrane 16 applied thereon.

Such an approach is in no way mandatory in so far as, e.g., coupling of the cap member 18 with the semiconductor die 14 may take place with the elements shown turned 180° with respect to the depiction of part a) of FIG. 4, that is with the cap member 18 coupled from above with the semiconductor die 14, so that no overturning may be needed for mounting onto the substrate 12.

Similarly, in one or more embodiments, an overturning movement may involve the substrate 12 and the membrane 16 coupled therewith, that is with the substrate 12 originally arranged with the electrically conductive formations 120 facing downwardly and the membrane 16 coupled to the substrate 12 from below—and not from above as shown in portion b)—with the resulting assembly including the substrate 12 "above" and the membrane 16 "below", being possibly overturned for coupling to the cap member 18 and the semiconductor die 14 as shown in part c). In one or more embodiments such overturning may not be required in so far as the coupling configuration exemplified in figure c) may be implemented with the substrate 12/membrane 16 located above the cap member 18 having the semiconductor die 14 arranged therein.

These examples (and other possible arrangements conceivable) indicate that the orientations of the various elements shown in FIG. 4 may be different from those presented here merely by way of example.

Whatever the arrangement, the final result of one or more embodiments may be producing a semiconductor device 12 as shown in part d) of FIG. 4, which essentially corresponds to the structure exemplified in FIG. 1.

In addition to providing a simple assembly process, one or more embodiments may permit to allow for differences in thermal expansion coefficients of the various parts involved (including a relative mismatch possibly arising during package life).

This may occur, e.g., by means of the membrane 16 which may provide satisfactory electrical performance even in offset conditions and/or may absorb shear stresses which may arise as result of different thermal expansion coefficients.

This may apply to both static and variable stresses, with offsets of, e.g., about 8 micron ($8\times10^{-6}$ m) as possibly arising at a temperature of 150° C. on 10×10 mm dice leading to 2.25 micron ($2.25\times10^{-6}$ m) variations on the silicon material of the semiconductor die 14 and 10.5 micron ($10.5\times10^{-6}$ m) on the material of the substrate (PCB) 12 compensated by the anisotropic membrane 16.

Without prejudice to the underlying principles, the details and embodiments may vary, even significantly, with respect to what has been described by way of example only, without departing from the extent of protection.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A method of assembling a semiconductor device, the method comprising:
    coupling an anisotropic conductive membrane to a surface of a substrate, the anisotropic conductive membrane including conductive fibers dispersed in an insulating matrix, the surface of the substrate having electrically conductive formations;
    coupling a semiconductor die to a cap member;
    aligning the cap member with the surface of the substrate and a first surface of the anisotropic conductive membrane thereby aligning electrical contact pillars coupled to the semiconductor die with the first surface of the anisotropic conductive membrane and with the electrically conductive formations of the surface of the substrate, the semiconductor die being coupled to the cap member;
    after aligning, coupling the cap member to the substrate thereby compressing first portions of the anisotropic conductive membrane by pressing the electrical contact pillars against the first surface of the anisotropic conductive membrane, wherein compressing first portions of the anisotropic conductive membrane forms electrically conductive vertical paths in the anisotropic conductive membrane from the first surface to a second surface opposite the first surface, while second portions of the anisotropic conductive membrane that are not compressed include conductive fibers that are dispersed throughout the insulating matrix but do not form electrical conductive vertical paths in the anisotropic conductive membrane; and
    coupling the semiconductor die to the substrate with the anisotropic conductive membrane between the semiconductor die and the substrate.

2. The method of claim 1, wherein coupling the anisotropic conductive membrane to the substrate comprises using an adhesive to couple the anisotropic conductive membrane to the substrate.

3. The method of claim 1, wherein coupling the cap member to the semiconductor die comprises using an adhesive to couple the cap member to the semiconductor die.

4. A method comprising:
    coupling an anisotropic conductive membrane to a surface of a substrate having conductive formations, the anisotropic conductive membrane including conductive fibers dispersed in an insulating matrix;
    coupling a semiconductor die to a cap, the semiconductor die including electrical contact pillars;
    aligning the cap with the anisotropic conductive membrane and the substrate after the cap is coupled to the semiconductor die, thereby aligning the electrical contact pillars with the conductive formations; and coupling the cap to the substrate, thereby compressing portions of the anisotropic conductive membrane with the electrical contact pillars and forming electrically conductive vertical paths in the anisotropic conductive membrane between the electrical contact pillars and the conductive formations.

5. The method of claim 4, further comprising, while forming electrically conductive vertical paths, second portions of the anisotropic conductive membrane are not compressed such that conductive fibers are dispersed throughout the insulating matrix but do not form electrical conductive vertical paths in the anisotropic conductive membrane.

6. The method of claim 4, wherein coupling the cap to the semiconductor die comprises using an adhesive to couple the cap to the semiconductor die.

7. The method of claim 4, wherein coupling the anisotropic conductive membrane to the surface of the substrate comprises using an adhesive to couple the anisotropic conductive membrane to the surface of the substrate.

8. A method comprising:
coupling a first surface of an anisotropic conductive membrane to a substrate having electrically conductive formations on a surface, the anisotropic conductive membrane including conductive fibers dispersed in an insulating matrix;
coupling a semiconductor die to a cap member, the semiconductor die including electrical contact pillars;
aligning the cap member with a second surface of the anisotropic conductive membrane and the substrate, thereby aligning the electrical contact pillars with the second surface of the anisotropic conductive membrane and with the electrically conductive formations, the second surface of the anisotropic conductive membrane being opposite the first surface of the anisotropic conductive membrane; and
coupling the cap member to the substrate thereby compressing first portions of the anisotropic conductive membrane with the electrical contact pillars and forming electrically conductive vertical paths in the first portions of the anisotropic conductive membrane between the electrical contact pillars and the electrically conductive formations, wherein second portions of the anisotropic conductive membrane are not compressed and include conductive fibers that are dispersed throughout the insulating matrix but do not form electrical conductive vertical paths in the anisotropic conductive membrane.

9. The method of claim 8, wherein coupling the anisotropic conductive membrane to the substrate comprises using an adhesive to couple the anisotropic conductive membrane to the substrate.

10. The method of claim 8, wherein coupling the cap member to the semiconductor die comprises using an adhesive to couple the cap member to the semiconductor die.

* * * * *